United States Patent [19]
Fukuda

[11] Patent Number: 5,861,780
[45] Date of Patent: Jan. 19, 1999

[54] VARIABLE FREQUENCY RING OSCILLATOR AND PHASE LOCKED LOOP CIRCUIT TO WHICH THE RING OSCILLATOR IS ADAPTED

[75] Inventor: Shinichi Fukuda, Kanagawa, Japan

[73] Assignee: Sony Corporation, Tokyo, Japan

[21] Appl. No.: 802,929

[22] Filed: Feb. 20, 1997

[30] Foreign Application Priority Data

Feb. 29, 1996 [JP] Japan ................................. 8-067521

[51] Int. Cl.⁶ .............................. H03B 5/02; H03L 7/099
[52] U.S. Cl. .............................. 331/57; 331/34; 331/179
[58] Field of Search ................................ 331/34, 57, 179

[56] References Cited

U.S. PATENT DOCUMENTS

| | | | |
|---|---|---|---|
| 4,978,927 | 12/1990 | Hausman et al. | 331/57 |
| 5,075,640 | 12/1991 | Miyazawa | 331/25 |
| 5,257,294 | 10/1993 | Pinto et al. | 331/57 |
| 5,349,311 | 9/1994 | Mentzer | 331/57 |
| 5,389,898 | 2/1995 | Taketoshi et al. | 331/57 |
| 5,418,499 | 5/1995 | Nakao | 331/57 |
| 5,448,205 | 9/1995 | Rothermel | 331/57 |
| 5,490,182 | 2/1996 | Arai | 375/376 |
| 5,689,213 | 11/1997 | Sher | 331/57 |

*Primary Examiner*—Siegfried H. Grimm
*Attorney, Agent, or Firm*—Jay H. Maioli

[57] ABSTRACT

A ring oscillator having an odd number of inverters selectively connected in a ring-like form includes a changing circuit for changing the ring-like connection by selectively returning the output of an arbitrary odd-numbered one of the inverters as the input to the initial-stage inverter. A phase locked loop circuit having this ring oscillator is also formed using this technique.

5 Claims, 12 Drawing Sheets

FIG. 1
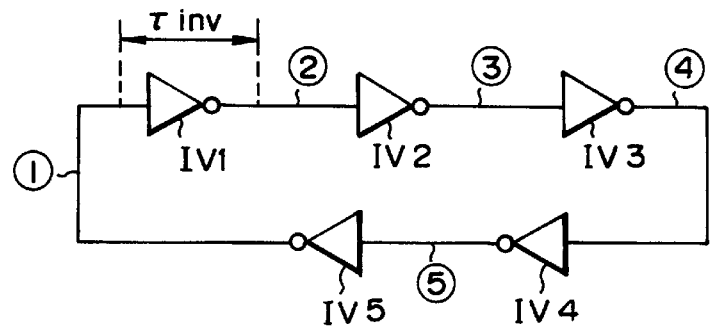
FIG. 2A
FIG. 2B
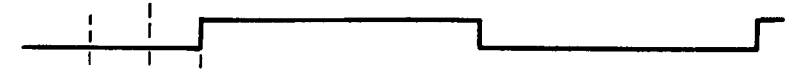
FIG. 2C
FIG. 2D
FIG. 2E MINIMUM PERIOD Tmin = 2 τ bias
MAXIMUM PERIOD Tmax = 2 (τbias + 63τinv)

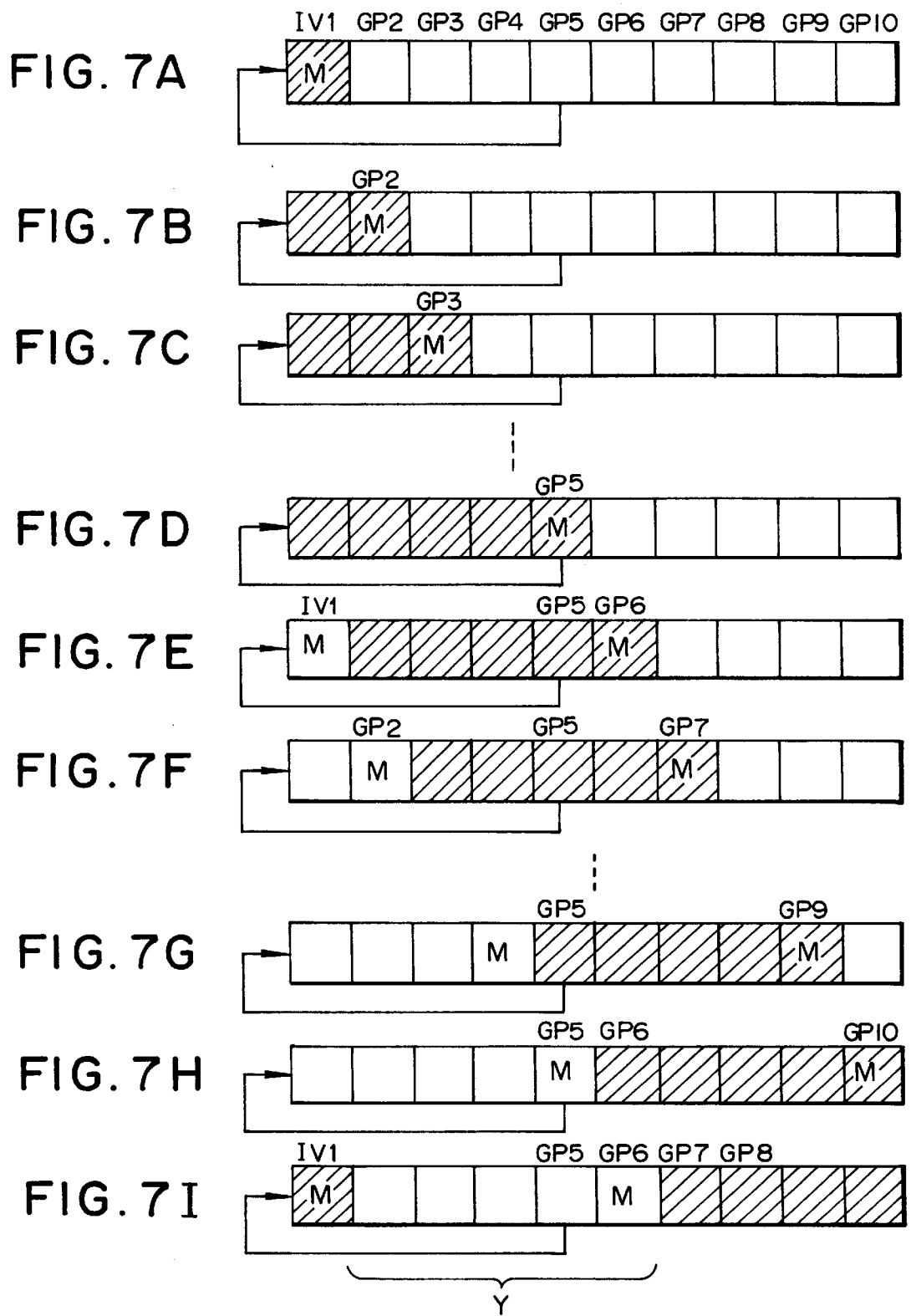

CHANGE FROM GP5 TO GP9

FIG. 12

| VALUE | BINARY CODE | GRAY CODE | VALUE | BINARY CODE | GRAY CODE | VALUE | BINARY CODE | GRAY CODE | VALUE | BINARY CODE | GRAY CODE |
|---|---|---|---|---|---|---|---|---|---|---|---|
| 0 | 000000 | 000000 | 16 | 010000 | 011000 | 32 | 100000 | 110000 | 48 | 110000 | 101000 |
| 1 | 000001 | 000001 | 17 | 010001 | 011001 | 33 | 100001 | 110001 | 49 | 110001 | 101001 |
| 2 | 000010 | 000011 | 18 | 010010 | 011011 | 34 | 100010 | 110011 | 50 | 110010 | 101011 |
| 3 | 000011 | 000010 | 19 | 010011 | 011010 | 35 | 100011 | 110010 | 51 | 110011 | 101010 |
| 4 | 000100 | 000110 | 20 | 010100 | 011110 | 36 | 100100 | 110110 | 52 | 110100 | 101110 |
| 5 | 000101 | 000111 | 21 | 010101 | 011111 | 37 | 100101 | 110111 | 53 | 110101 | 101111 |
| 6 | 000110 | 000101 | 22 | 010110 | 011101 | 38 | 100110 | 110101 | 54 | 110110 | 101101 |
| 7 | 000111 | 000100 | 23 | 010111 | 011100 | 39 | 100111 | 110100 | 55 | 110111 | 101100 |
| 8 | 001000 | 001100 | 24 | 011000 | 010100 | 40 | 101000 | 111100 | 56 | 111000 | 100100 |
| 9 | 001001 | 001101 | 25 | 011001 | 010101 | 41 | 101001 | 111101 | 57 | 111001 | 100101 |
| 10 | 001010 | 001111 | 26 | 011010 | 010111 | 42 | 101010 | 111111 | 58 | 111010 | 100111 |
| 11 | 001011 | 001110 | 27 | 011011 | 010110 | 43 | 101011 | 111110 | 59 | 111011 | 100110 |
| 12 | 001100 | 001010 | 28 | 011100 | 010010 | 44 | 101100 | 111010 | 60 | 111100 | 100010 |
| 13 | 001101 | 001011 | 29 | 011101 | 010011 | 45 | 101101 | 111011 | 61 | 111101 | 100011 |
| 14 | 001110 | 001001 | 30 | 011110 | 010001 | 46 | 101110 | 111001 | 62 | 111110 | 100001 |
| 15 | 001111 | 001000 | 31 | 011111 | 010000 | 47 | 101111 | 111000 | 63 | 111111 | 100000 | ized by digitizing processing in a phase error
VARIABLE FREQUENCY RING OSCILLATOR AND PHASE LOCKED LOOP CIRCUIT TO WHICH THE RING OSCILLATOR IS ADAPTED

BACKGROUND OF THE INVENTION

1. Field of the Invention

The present invention relates to a ring oscillator variable in oscillation frequency and a phase locked loop (PLL) circuit using the ring oscillator.

2. Description of the Related Art

In the process of reproducing digital data recorded on a recording medium, e.g., a magnetic tape or a magneto-optical disk, a reproducing clock for extracting bits (so-called bit clock signal) is required to extract reproduced data from information read out from the recording medium. PLL circuits are generally used for the purpose of generating such a clock synchronized with information read out.

Conventionally, PLL circuits are ordinarily formed as analog circuits. Recently, however, the digitization of processing in PLL circuits has been advanced. Digital PLL circuits are realized by digitizing processing in a phase error detection section, in an error signal filtering processing section and in a clock oscillation circuit section.

However, it has been difficult to form digital PLL circuits because of the difficulty in forming a digital clock oscillation circuit section.

For example, an oscillation circuit is frequently used in which a master clock having a frequency sufficiently higher than that of a reproducing clock is prepared, and in which the master clock is suitably divided to form the reproducing clock. If the frequency of the reproducing clock is higher, the frequency of the master clock must be increased correspondingly. It is considered that the necessary frequency of the master clock is, ordinarily, several times to several tens of times higher than the frequency of the reproducing clock. Therefore, there is a limit to frequencies usable as the frequency of the master clock if the frequency of the reproducing clock is increased. For this reason, it is difficult to form digital PLL circuits.

Under these circumstances, there is a demand for digital oscillators which are oscillators capable of controlling the oscillation frequency by a digital code unlike analog voltage controlled oscillators having an oscillation frequency that is voltage-controlled, and which are capable of obtaining an oscillation output without dividing the master clock frequency.

SUMMARY OF THE INVENTION

In view of these circumstances, an object of the present invention is to provide a ring oscillator arranged as a favorable digital oscillator and a PLL circuit using the ring oscillator.

To achieve this object, according to one aspect of the present invention, there is provided a ring oscillator having first to nth inverters (n: an odd number equal to or larger than 3) connected in series, a selector for changing a connection between the plurality of inverters connected in series by arbitrarily selecting an output point of one of the odd-numbered inverters in the plurality of inverters connected in series and connecting the selected output point to an input point of the first inverter forming an initial stage, and a selector controller for controlling selection of one of output points of a plurality of odd-numbered inverters in the plurality of inverters connected in series.

According to another aspect of the present invention, there is provided a phase locked loop circuit for variably controlling the frequency of a signal output from a variable frequency oscillation circuit according to a phase error signal obtained from an input signal, the phase locked loop circuit having first to nth inverters (n: an odd number equal to or larger than 3) connected in series, a selector for changing a connection between the plurality of inverters connected in series by arbitrarily selecting an output point of one of the odd-numbered inverters in the plurality of inverters connected in series and connecting the selected output point to an input point of the first inverter forming an initial stage, and a selector controller for controlling selection of one of the output points of a plurality of odd-numbered inverters in the plurality of inverters connected in series.

BRIEF DESCRIPTION OF THE DRAWINGS

FIG. 1 is a block diagram of a ring oscillator;

FIG. 2A is a timing chart of an output signal from first inverter IV1;

FIG. 2B is a timing chart of an output signal from second inverter IV2;

FIG. 2C is a timing chart of an output signal from third inverter IV3;

FIG. 2D is a timing chart of an output signal from fourth inverter IV4;

FIG. 2E is a timing chart of an output signal from fifth inverter IV5;

FIG. 7A is a diagram showing a position at which a conflict occurs in a 5-stage ring oscillator;

FIG. 7B is a diagram showing a transition of the conflicting position from IV1 to IV2 in the 5-stage ring oscillator;

FIG. 7C is a diagram showing a transition of the conflicting position from IV2 to IV3 in the 5-stage ring oscillator;

FIG. 7D is a diagram showing a transition of the conflicting position from IV4 to IV5 in the 5-stage ring oscillator;

FIG. 7E is a diagram showing a transition of the conflicting position from IV5 to IV1 and a transition of the conflicting position from IV5 to IV6 in the 5-stage ring oscillator;

FIG. 7F is a diagram showing a transition of the conflicting position from IV6 to IV7 and a transition of the conflicting position from IV1 to IV2 in the 5-stage ring oscillator;

FIG. 7G is a diagram showing a transition of the conflicting position from IV8 to IV9 and a transition of the conflicting position from IV3 to IV4 in the 5-stage ring oscillator;

FIG. 7H is a diagram showing a transition of the conflicting position from IV9 to IV10 and a transition of the conflicting position from IV4 to IV5 in the 5-stage ring oscillator;

FIG. 7I is a diagram showing a transition of the conflicting position from IV10 to IV1 and a transition of the conflicting position from IV5 to IV6 in the 5-stage ring oscillator;

FIG. 9A is a diagram showing positions at which conflicts occur at the time of change from the 5-stage inverter to a 7-stage inverter;

FIG. 9B is a diagram showing transitions of the conflicting positions after the change from the 5-stage inverter to the 7-stage inverter;

FIG. 9C is a diagram showing transitions of the conflicting positions after the change from the 5-stage inverter to the 7-stage inverter;

FIG. 9D is a diagram showing transitions of the conflicting positions after the change from the 5-stage inverter to the 7-stage inverter;

FIG. 9E is a diagram showing transitions of the conflicting positions after the change from the 5-stage inverter to the 7-stage inverter;

FIG. 12 is a table of binary to gray code conversion; and

DESCRIPTION OF THE PREFERRED EMBODIMENTS

Figure 3:
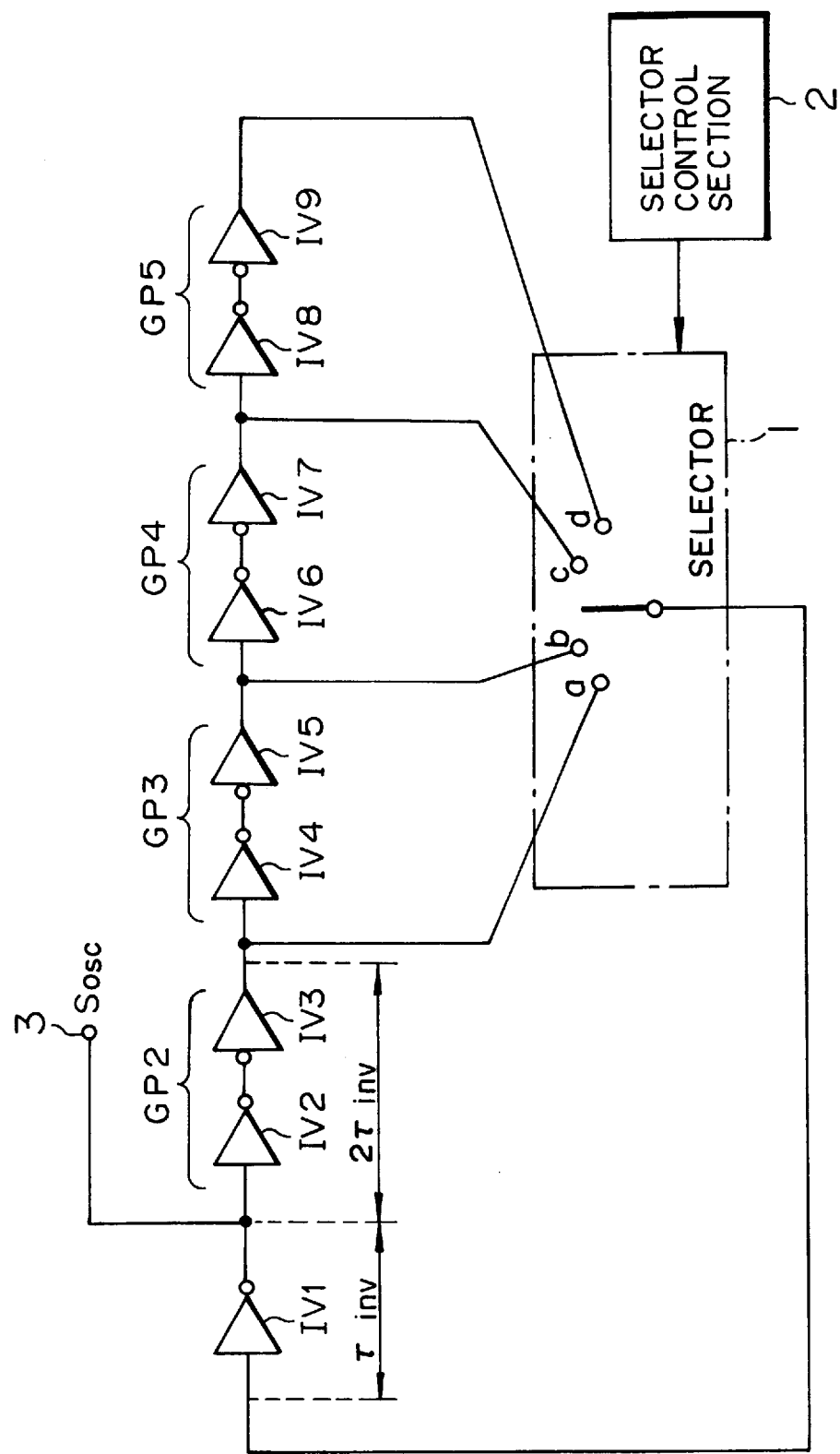
FIG. 3 is a block diagram of a 4-step changeable ring oscillator which represents a first embodiment of the present invention.

The present invention will be described in detail with respect to the subjects below, i.e., the principle of a ring oscillator, examples of the ring oscillator which represent embodiments of the present invention, and an example of a PLL circuit which represents a further embodiment of the present invention will be described.
1. The principle of Ring Oscillator
2. Variable Oscillation Frequency Ring Oscillator
3. Variable Oscillation Frequency Ring Oscillator Having Oscillation On/Off function
4. Setting Limit to the Number of Changing Steps in Variable Oscillation Frequency Ring Oscillator
5. Variable Oscillation Frequency Ring Oscillator Frequency-Controlled with Gray Code
6. PLL circuit Using Variable Oscillation Frequency Ring Oscillator 1. The Principle of Ring Oscillator The principle of a ring oscillator will first be described with reference to FIG. 1. Basically, a ring oscillator is formed of a certain odd number of inverters connected in a ring-like series form.

FIG. 1 shows an example of the ring oscillator in which five inverters IV1 to IV5 are connected in series so as to form a loop.

As is well known, an inverter is stable when the logical states of the input and output are different from each other (for example, when the input is "High (H)" while the output is "Low (L)"). In a case where a certain odd number of inverters are connected in a looped series form as shown in FIG. 1, logical equality occurs always inevitably between the input and the output of some of the inverters. Such a state is referred to as "conflicting state or conflict" in this specification.

When a predetermined one of the inverters has a conflict, it inverts its output logical state to become stable. Simultaneously, the output of this inverter causes a conflict at the subsequent inverter. In the ring oscillator, the position of the conflicting state is successively shifted in this manner. The ring oscillator is expected to oscillate reliably by this operation.

If as shown in FIG. 1 the delay time from a change in the input of one inverter to a subsequent change in the output of the same inverter is τinv, the period of oscillation of a ring oscillator having N stages (five stages in the example shown in FIG. 1) is 2Nτinv. For ease of explanation, the delay time is assumed to be τinv with respect to each of the change of the inverter output from "H" to "L" and the change of the inverter output from "L" to "H".

FIGS. 2A to 2E show the logical states of the inputs and outputs ① to ⑤ of the inverters IV1 to IV5.

First, till time t1, the input ① of the inverter IV1 is "L" and the output ② of the inverter IVI is "H", so that the inverter IV1 is stable. After time t1 when the input ① of the inverter IV1 becomes "H", both the input and the output of the inverter IV1 are "H", that is, the inverter IV1 has a conflict.

This conflict is canceled at time t2 when the output ② of the inverter IV1 becomes "L". The delay time corresponding to the time for this inversion is represented by τinv in FIG. 2A.

By the inversion of the output ② of the inverter IV1 (=the input ② of the inverter IV2) to "L", a conflict is caused at the inverter IV2. However, at time t3, τinv after this inversion, the inverter IV2 inverts the output ③ to become stable. Then a conflict occurs at the inverter IV3.

That is, the logical state at each of the points ① to ⑤ changes with the completion of one cycle of propagation of the conflicting state through the circuit. Accordingly, the length of continuance (duration) of "H" or "L" level is 5τinv in the circuit formed of five inverters IV1 to IV5, as shown in FIGS. 2A to 2E.

For example, a signal having a waveform such as that shown in FIG. 2A can be extracted from the point ① in FIG. 1, that is, a signal (clock) having a period of 2×5τinv can be obtained.

In the embodiments of the present invention described below, variable frequency generators are realized by using such a ring oscillator and by changing the number of looped inverters.

That is, the ring connection state of inverters is changed between a loop of one inverter, a loop of three inverters, a loop of five inverters, a loop of seven inverters and so on to change the period of a generated clock signal in the range of various periods of 2×τinv, 2×3τinv, 2×5τinv, 2×7τinv, etc., thus realizing a variable frequency generator.

2. Variable Oscillation Frequency Ring Oscillator

FIG. 3 shows a ring oscillator which is capable of changing the oscillation frequency by four steps, and which represents an embodiment of the present invention.

The ring oscillator shown in FIG. 3 has nine inverters IV1 to IV9 connected in series. For convenience of explanation, a pair of inverters IV2 and IV3, a pair of inverters IV4 and IV5, a pair of inverters IV6 and IV7, and a pair of inverters IV8 and IV9 will be referred to as inverter groups GP2, GP3, GP4, and GP5, respectively.

The delay time from a change in the input of each of the inverters IV1 to IV9 to a subsequent change in the output of the same inverter is $\tau inv$. Then, with respect to each of the inverter groups GP2 to GP5, the delay time corresponding to the time for logical inversion of the two inverters is $2\tau inv$.

Output points of the inverter groups GP2 to GP5 are respectively connected to terminals a, b, c, and d of a selector 1. The selector 1 selects one of four selection points, i.e., one of the terminals a to d, under the control of a selector control section 2, thereby connecting the selected terminal to the input terminal of the inverter IV1.

When the terminal a is selected by the selector 1, three inverters, i.e., inverters IV1 to IV3, form a loop. When the terminal b is selected, five inverters, i.e., inverters IV1 to IV5, form a loop. When the terminal c or d is selected, seven or nine inverters form a loop.

If the output of the inverter IV1 of this ring oscillator is extracted through a terminal 3 as an oscillation output $S_{OSC}$, one of four frequencies shown in FIGS. 4A to 4D can be obtained as oscillation output $S_{OSC}$ according to the state of connection in the selector 1.

Figure 4A:
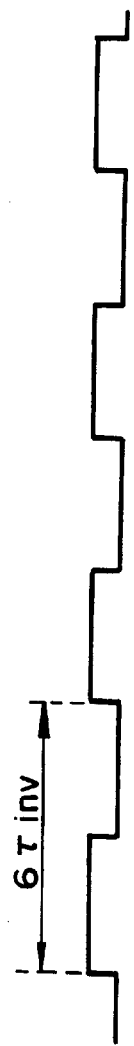
FIG. 4A is a timing chart of oscillation output $S_{OSC}$ when terminal a is selected.

That is, when the terminal a is selected in the selector 1, oscillation occurs in the loop formed by inverters IV1 to IV3 and a clock signal having a period of $2\times3\tau inv$, i.e., $6\tau inv$, is obtained as oscillation output $S_{OSC}$, as shown in FIG. 4A.

Figure 4B:
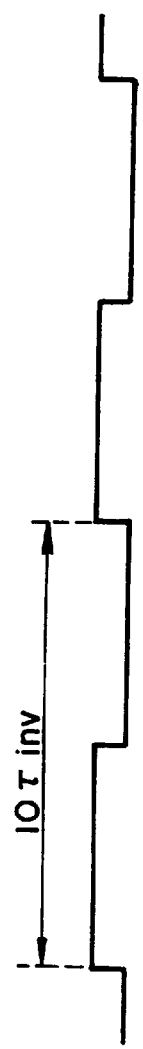
FIG. 4B is a timing chart of oscillation output $S_{OSC}$ when terminal b is selected.
Figure 4C:
FIG. 4C is a timing chart of oscillation output $S_{OSC}$ when terminal c is selected.
Figure 4D:
FIG. 4D is a timing chart of oscillation output $S_{OSC}$ when terminal d is selected.

Similarly, when the terminal b is selected in the selector 1, oscillation occurs in the loop formed by inverters IV1 to IV5 and a clock signal having a period of $10\tau inv$ is obtained as oscillation output $S_{OSC}$, as shown in FIG. 4B. When the terminal c is selected in the selector 1, a clock signal having a period of $14\tau inv$ is obtained as oscillation output $S_{OSC}$, as shown in FIG. 4C. When the terminal d is selected in the selector 1, a clock signal having a period of $18\tau inv$ is obtained as oscillation output $S_{OSC}$, as shown in FIG. 4D.

Thus, in this ring oscillator, the selector control section 2 controls the operation of changing the connection terminals in the selector 1 to selectively set the frequency of output clock signal $S_{OSC}$ to one of four frequencies.

3. Variable Oscillation Frequency Ring Oscillator Having Oscillation On/Off function An example of a ring oscillator capable of changing the frequency of clock signal $S_{OSC}$ sixty four steps and also capable of on or off control of the oscillating operation will next be described with reference to FIGS. 5 and 6. A circuit portion of this ring oscillator corresponding to the selector 1 and the selector control section 2 of the example shown in FIG. 3 will be described specially in detail. One hundred and twenty seven inverters IV1 to IV127 are connected in series. A pair of inverters IV2 and IV3 and other subsequent pairs of inverters of this second embodiment of the present invention will be referred to as inverter groups GP2 to GP64, as are those of the first embodiment.

An OR gate OR1 is disposed in front of the inverter IV1. An output from a selector 1 and a control signal $S_{ON/OFF}$ for on or off control of the oscillating operation are supplied to the OR gate OR1. A logical add output from the OR gate OR1 is supplied to the inverter IV1.

Output points of the inverter IV1 and the inverter groups GP2 to GP64 are respectively connected to AND gates A1 to A64 in the selector 1.

Outputs of the AND gates A1 to A64 are supplied to an OR gate OR2, and an output of the OR gate OR2 is supplied as an output of the selector 1 to one of the two input terminals of the OR gate OR1.

A decoder 6 is connected to the AND gates A1 to A64 so as to supply selecting signals SL1 to SL64 to the AND gates A1 to A64, respectively. When one of the selecting signals SL1 to SL64 is at "H" level, the other sixty three signals are at "L" level. That is, one of the AND gates A1 to A64, i.e., one of the output points of the inverter IV1 and the inverter groups GP2 to GP64, is selected by "H" level signal supplied as one of selecting signals SL1 to SL64, and the logical state of the selected output point (selection point) is supplied to the OR gate OR1 through the OR gate OR2.

That is, the number of looped inverters in the ring oscillator can be selected from the group of sixty four odd numbers 1, 3, 5, . . . 125, 127 by selecting one of the AND gates A1 to A64 through selecting signals SL1 to SL64.

In this embodiment, with respect to each of the inverter groups GP2 to GP64, the delay time corresponding to the time for logical inversion of the two inverters is represented by $\tau inv$ while the delay time corresponding to the time for logical inversion of the OR gate OR1 and the inverter IV1 is represented by $\tau bias$.

In this ring oscillator, the output of the inverter IV1 is extracted through a terminal 3 as an oscillation output $S_{OSC}$ of the ring oscillator.

The output of the inverter IV1 is also used as a latch clock for flip-flops FF1 to FF6.

A step number setting section 5 sets one of sixty four step numbers designating one of the odd numbers from which the number of looped inverters in the ring oscillator is selected. The number of looped inverters is changed by selecting the corresponding one of the sixty four AND gates A1 to A64 in the selector 1. The step number setting section 5, the flip-flops FF1 to FF6 and the decoder 6 correspond to the selector control section 2 in the embodiment shown in FIG. 3.

The step number setting section 5 generates a number to be selected from the sixty four step numbers (1 to 64). For example, this number is generated in a 6-bit binary code (000000 to 111111).

Six bits of this data are respectively supplied as D inputs to the flip-flops FF1 to FF6.

The flip flops FF1 to FF6 latch the input values from the step number setting section 5 and output the values to the decoder 6 by being triggered by a rise of the output of the inverter IV1 (i.e., clock signal $S_{OSC}$). The decoder 6 generates selecting signals SL1 to SL64 according to the input 6-bit value.

For example, when the first step of the 64-step change of the ring oscillator is selected, the step number setting section 5 outputs code bits "000000". These code bits are supplied to the decoder 6 by triggering with a rise of clock signal $S_{OSC}$. The decoder 6 decodes this input into "1", "0", "0", "0", . . . "0" and outputs these values as values of selecting signals SL1 to SL64. The AND gate A1 is thereby selected and the output of the inverter IV1 is returned to the OR gate OR1 through the selector 1. That is, in this case, the ring oscillator has a loop formed of one inverter.

When the second step is selected, the step number setting section 5 outputs code bits "000001". In response to this, the decoder 6 outputs "0", "1", "0", "0", . . . "0" as values of selecting signals SL1 to SL6. The AND gate A2 is thereby selected and the output of the inverter IV3 is returned to the OR gate OR1 through the selector 1. That is, in this case, the ring oscillator has a loop formed of three inverters.

When the step number setting section 5 outputs code bits "111111", the decoder 6 sets "0", "0", "0", "0", . . . "1" as values of selecting signals SL1 to SL6 to select the AND gate A64. In this case, the ring oscillator has a loop formed of 127 inverters.

In the thus-arranged ring oscillator, the period T of the output clock signal $S_{OSC}$ is $2\{\tau bias+(N-1)\times\tau inv\}$ when the Nth step of the 64-step change is selected (when the AND gate A(N) is selected).

When the AND gate A1 is selected (when N=1), the period T of clock signal $S_{OSC}$ is minimized, that is, clock signal $S_{OSC}$ having the shortest period Tmin=2τbias is obtained.

When the AND gate A64 is selected (when N=64), the period T of clock signal $S_{OSC}$ is maximized, that is, clock signal $S_{OSC}$ having the longest period Tmax=2(τbias+63τinv) is obtained.

Consequently, one of signals of different sixty four periods from the period Tmin to the period Tmax can be obtained as clock signal $S_{OSC}$. In other words, the frequency of the clock signal $S_{OSC}$ output from the ring oscillator can be changed sixty four steps.

In this embodiment, control signal $S_{ON/OFF}$ for on or off control of the oscillating operation is supplied to the one of two input terminals of the OR gate OR1.

When control signal $S_{ON/OFF}$ is at "L" level, the output of the OR gate OR1 has the same logical state as the output of the selector 1. Accordingly, the oscillator operates to oscillate by propagation of the conflicting state in the loop of an odd number of inverters.

On the other hand, when control signal $S_{ON/OFF}$ is at "H" level, the output of the OR gate OR1 is constantly "H" and the inverter IV1 is constantly stable in the "H" input and "L" output state. That is, propagation of the conflicting state is shut off by the OR gate OR1 in the loop of the odd number of inverters. The oscillation output of the ring oscillator is thereby stopped; clock signal $S_{OSC}$ is constantly at "L" level and the clock output is stopped.

As described above, the ring oscillator of this embodiment can be arbitrarily set in the state of executing or stopping the operation of outputting the clock signal by being supplied with control signal $S_{ON/OFF}$. Advantageously, because of the capability of on or off control of the oscillating operation, it is possible to stabilize the oscillating operation of the ring oscillator.

As can be understood from the explanation of the principle of the ring oscillator with reference to FIG. 1, the ring oscillator can oscillate stably by propagation of the conflicting state from one of an odd number of inverters. However, some odd number of inverters in the total number of looped inverters may have conflicts simultaneously. In such a situation, there is a possibility of an undesirable output of an odd-number-multiple frequency unstable in period.

Ordinarily, even if a plurality of conflicts occur, they converge into one in such a manner that two of them meet each other at a certain time because there is a difference between their propagation speeds. However, there is also a risk of an odd number of conflicts being maintained continuously and stably. Even if a plurality of conflicts naturally converge into one in most cases, the problem of the unstable frequency state of the output clock before convergence into one conflict is still considerable.

Such a state of existence of an odd number of conflicts is liable to occur, for example, when the power supply is turned on.

If on or off control of oscillation can be performed as in this embodiment of the present invention, the ring oscillator may be temporarily stopped from oscillating in such a situation and thereafter started when the inputs and outputs of the inverters are stabilized, thereby ensuring that only one conflict occurs at a time. In this manner, stabilized oscillation can be achieved. That is, in this embodiment, a ring oscillator can be arranged as a high-performance variable frequency generator by using control signal $S_{ON/OFF}$ as a trigger for resetting or starting oscillation.

Figure 5:
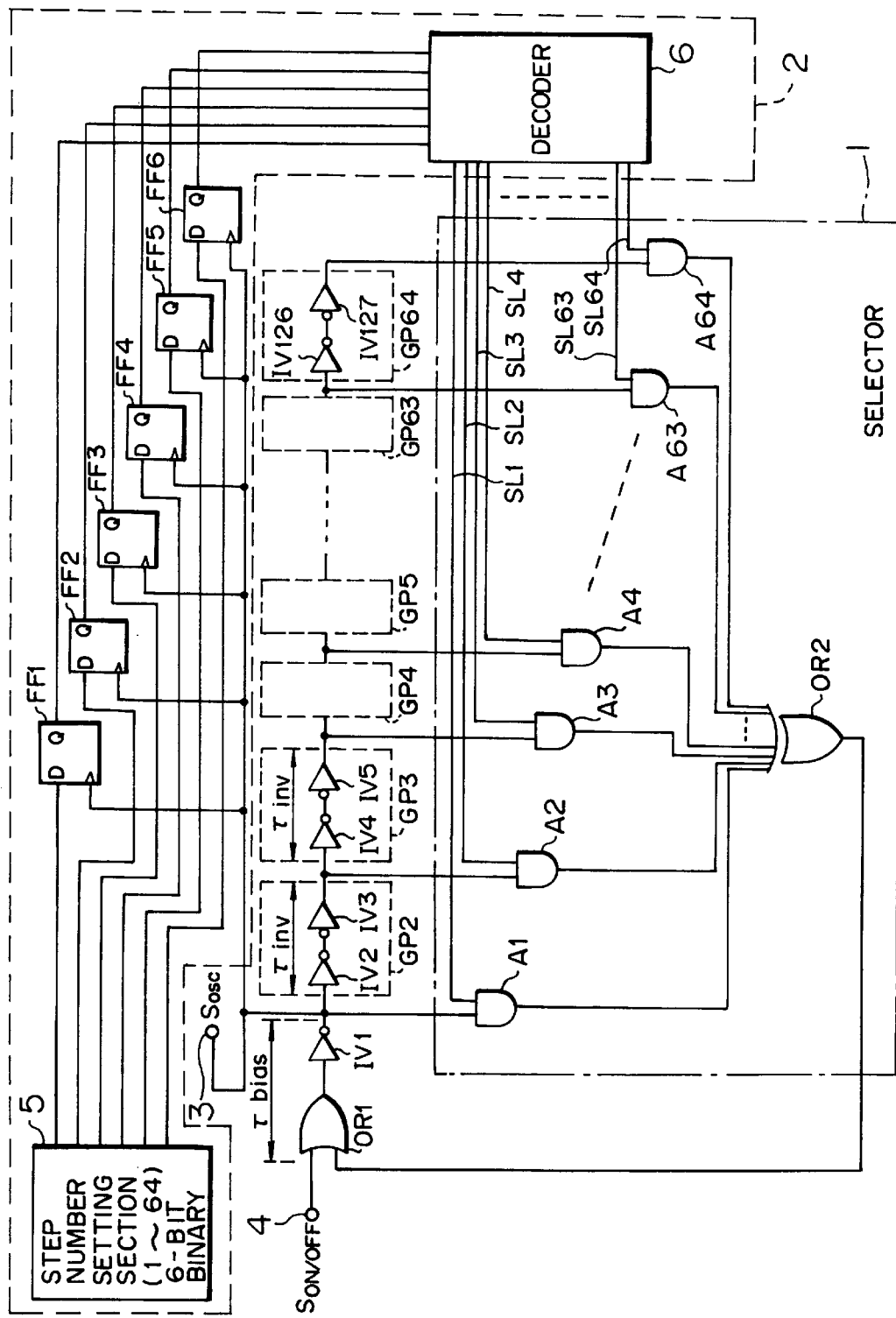
FIG. 5 is a block diagram of a 64-step changeable ring oscillator which represents a second embodiment of the present invention.
Figure 6:
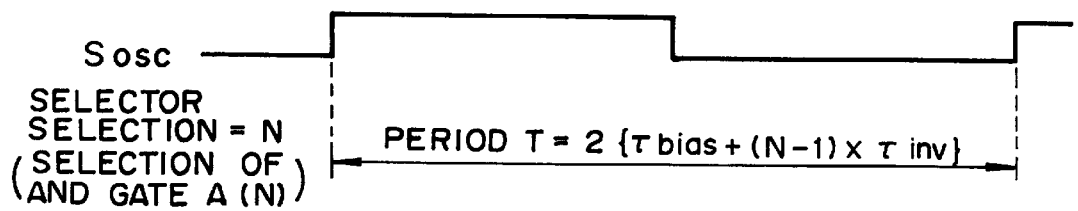
FIG. 6 is a timing chart of oscillation output $S_{OSC}$ in the second embodiment of the present invention.

Needless to say, in the arrangement shown in FIG. 5, a NOR gate having the same function as the set of OR gate OR1 and inverter IV1 may be used instead of OR gate OR1 and inverter IV1. Also, needless to say, the same oscillation on or off control can be achieved by using a negative logic NOR gate (=positive logic NAND gate). In this case, the ring oscillator oscillates when control signal $S_{ON/OFF}$ is "H", and stops oscillating when control signal $S_{ON/OFF}$ is "L".

Further, the oscillation on or off control, described above as an operation performed at inverter IV1, alternatively may be performed at a suitable point in the array of inverter groups GP2 to GP64.

The above-described example of the selector 1 of this embodiment is formed of AND gates A1 to A64 and OR gate OR2 and is operated by selecting signals SL1 to SL64. However, needless to say, the selector 1 may alternatively be formed of any other logic circuit or the like.

4. Setting Limit to the Number of Changing Steps in Variable Oscillation Frequency Ring Oscillator Examples of the ring oscillator capable of changing the oscillation frequency in a step change manner have been described with reference to FIGS. 3 and 5. An operating method suitable for step change in such ring oscillators will next be described.

FIGS. 7A to 7I are diagrams for explaining the operation by using, as a model, a ring oscillator capable of changing the oscillation frequency ten steps. The ring oscillator has nineteen inverters connected in series and is arranged so as to be capable of arbitrarily selecting the output of one of the odd-numbered inverters.

Each of ten squares shown in each of FIGS. 7A to 7I represents one changing step selection point. In accord with the description with reference to FIGS. 3 and 5, it is assumed that the first square corresponds to inverter IV1 (first stage) and the second to tenth squares correspond to inverter groups GP2 to GP10 (second to tenth stages). Each of the hatched squares represents the "H" state of the output of the corresponding one of inverter IV1 and inverter groups GP2 to GP10 while each of the squares not hatched represents the "L" state of the corresponding output. The position of occurrence of a conflict is indicated by "M". At the position indicated by "M", the inverter or inverter group has a conflict and the output logic thereof is inverted.

FIGS. 7A to 7I show a situation where the fifth one of the ten stages is selected to form a loop.

For example, the outputs of inverter IV1 and inverter groups GP2 to GP10 are reset to "L" by the oscillation-off operation described above with reference to FIG. 5. A ring oscillator loop is then formed by inverter IV1 and inverter groups GP2 to GP5 to start oscillation.

First, since the output of inverter group GP5 is "L", a conflict exists at inverter IV1 and the output of inverter IV1 is inverted to "H", as shown in FIG. 7A. Subsequently, a conflict occurs at inverter group GP2 and the output of inverter group GP2 is inverted to "H", as shown in FIG. 7B. Then, a conflict occurs at inverter group GP3 and the output of inverter group GP3 is inverted to "H", as shown in FIG. 7C.

Propagation of the conflicting state continues in this manner. In the state shown in FIG. 7D, inverter group GP5 has a conflict and the output of inverter group GP5 is inverted to "H".

Next, a conflict occurs at inverter group GP6 and the output of inverter group GP6 is inverted to "H", as shown in FIG. 7E. However, since inverter IV1 and inverter groups GP2 to GP5 are looped, a conflict also occurs at inverter IV1 and the output of inverter IV1 becomes "L".

Thereafter, propagation of the conflicting state progresses in the same manner, as shown in FIGS. 7F and 7G. When a conflict occurs in inverter group GP5 and when the output thereof becomes "L", a conflict again occurs at inverter IV1 and the output thereof becomes "H", as shown in FIG. 7(H).

By repeating the above-described process, a signal having a certain frequency can be generated stably from the loop formed by inverter IV1 and inverter groups GP2 to GP5.

In the states shown in FIGS. 7E to 7I, conflicts exist at two positions. However, this is not a problem since a conflict occurs at only one position at a time in the oscillation loop.

The operation of changing the oscillation frequency will now be described. In the circuit of the embodiment shown in FIG. 5, the output of inverter IV1 is extracted as clock signal $S_{OSC}$ and is also used as a trigger for flip-flops FF1 to FF6. In accord with this, it is assumed that the changing operation in this case is also started by being triggered when the output of inverter IV1 rises. That is, the changing operation is started at a time corresponding to the state shown in FIG. 7I.

A time lag occurs as a time period from a moment at which changing triggering is done (the output of inverter IV1 rises) to a moment at which the selector 1 is thereafter changed actually. This time period includes the time for processing in the decoder 6 in the case of the arrangement shown in FIG. 5.

It is assumed here that propagation of the conflicting state progresses two steps in the time period of this time lag.

Figure 8A:
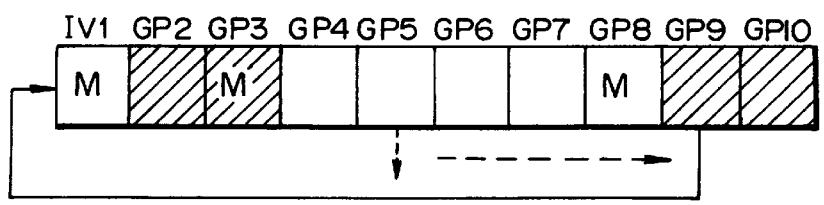
FIG. 8A is a diagram showing positions at which conflicts occur at the time of change from the 5-stage inverter to a 9-stage inverter.

On this assumption, a case where the ring oscillator is changed from the state shown in FIG. 7I, i.e., the state of loop connection at the fifth stage, to the state of loop connection at the ninth stage shown in FIG. 8A will be described.

In the state shown in FIG. 7I, conflicts exist at inverter IV1 and inverter group GP6. If as shown in FIG. 8A two-step propagation of each conflict is completed when the loop connection is changed, conflicts exist at inverter groups GP3 and GP8 when the loop connection is changed, as shown in FIG. 8A. Simultaneously, by the connection of the ninth stage, the output (H) of inverter group GP9, which is at H level at the time of this changing, is input to inverter IV1 to cause a conflict at inverter IV1, followed by inversion of the output to L level.

Figure 8B:
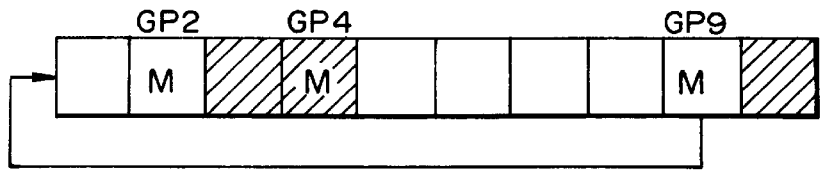
FIG. 8B is a diagram showing transitions of the conflicting positions after the change from the 5-stage inverter to the 9-stage inverter.
Figure 8C:
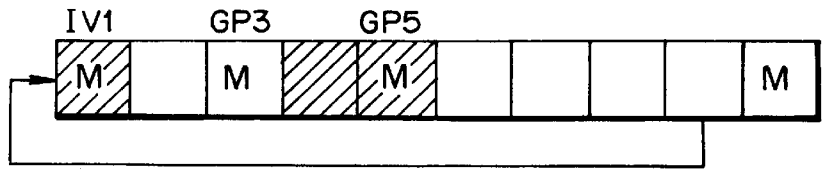
FIG. 8C is a diagram showing transitions of the conflicting positions after the change from the 5-stage inverter to the 9-stage inverter.

That is, existence of three conflicts in the oscillation loop results. These conflicts propagate as shown in FIGS. 8B and 8C, so that clock signal $S_{OSC}$, i.e., the output of inverter IV1, becomes a signal having a frequency different from the intended frequency, resulting in failure to obtain a clock having the frequency to be generated by the nine-step loop.

On the same assumption, a case where the ring oscillator is changed from the state shown in FIG. 7I, i.e., the state of loop connection at the fifth stage, to the state of loop connection at the seventh stage shown in FIG. 9A will next be described.

In the state shown in FIG. 7I, conflicts exist at inverter IV1 and inverter group GP6. If as shown in FIG. 9A two-step propagation of each conflict is completed when the loop connection is changed, conflicts exist at inverter groups GP3 and GP8 when the loop connection is changed, that is, only inverter group GP3 in the loop of inverter IV1 and inverter groups GP2 to GP7 has a conflict. By the connection of the seventh stage, the output (L) of inverter group GP7 is input to inverter IV1 having "H" level output at the time of this changing, thereby maintaining inverter IV1 in the stable state.

Thereafter, the conflicting state propagates as shown in FIGS. 9B to 9E, and clock signal $S_{OSC}$, i.e., the output of inverter IV1, becomes a signal having the intended frequency. Thus, the output clock frequency is changed correctly.

As can be understood from the above, it is desirable to set a limit to the number of changing steps when the output frequency is changed.

The number of changing steps is limited as described below.

It is assumed with respect to the ring oscillator shown in FIG. 5 that the time period from a moment at which the changing operation is triggered to a moment at which the loop connection is actually changed by the selector 1 is $\Delta t$, and that a conflict propagates Z steps in the time period $\Delta t$.

Also, Y stages are assumed to be in the same logical state, as shown in FIG. 7I.

The number of steps XF and the number of steps XR the connection is changeable from the present connection point under these conditions are determined as described below. The number of steps XF is a number of steps the connection can be changed from the present connection point in the direction of conflict propagation, and the number of steps XR is a number of steps the connection can be changed from the present connection point in the direction reverse to the direction of conflict propagation.

$XF \leq Z$ $XR \leq Y-Z$

In the state where the fifth stage (inverter group GP5) is presently connected as in the example shown in FIG. 7A to 7I, XF and XR are set as described below. That is, with respect to change for reducing the output clock frequency (change in the direction toward inverter group GP10), if the above-mentioned Z is 2, XF and XR are selected so that the connection point can be changed only within the range of two steps from the fifth stage at a time, that is, the connection point can be changed to the output point of inverter group GP6 or GP7. With respect to change for increasing the output clock frequency (change in the direction toward inverter IV1), if Z=2 and Y=5, the connection point can be changed only within the range of three steps from the fifth stage at a time, that is, the connection point can be changed to the output point of inverter group GP2, GP3 or GP4.

If there is a need to change the connection point out of these ranges, for example, to the output point of inverter group GP8, GP9 or GP10 or inverter IV1, the changing operation is executed two or more times to obtain the desired oscillation frequency.

Such conditions are set, for example, in the step number setting section 5 in the arrangement shown in FIG. 5. That is, to generate numerical values for changing the connection point, ranges of selection points in each of which one of the selection points can be selected are set in the opposite directions from the presently-selected selection point before output numerical values are generated. In this manner, clock signal $S_{OSC}$ output when the connection point is changed can be prevented from becoming unstable in frequency. Thus, the desired frequency can be obtained with improved stability.

5. Variable Oscillation Frequency Ring Oscillator Frequency-Controlled with Gray Code A variable oscillation frequency ring oscillator which is frequency-controlled by using a gray code will next be described with reference to FIG. 10.

It is assumed here that in a ring oscillator arranged as shown in FIG. 5 the changing operation is performed under a condition for avoiding the above-described problem such that the number of steps the loop connection point can be changed at a time is limited to one in each of the two changing directions from the presently-selected selection point (XF=1 and XR=1). In other words, one of only the two points adjacent to the presently-selected selection point can be selected. For example, from the state where inverter group GP3 (AND gate A3) is presently selected in the circuit shown in FIG. 5, the connection point can be changed only to the output point of one of inverter groups GP2 and GP4 at a time.

In the arrangement shown in FIG. 5, a value in the 6-bit binary code for designating a selected point is generated by the step number setting section 5.

If XF=and XR=1, a value generated by the step number setting section 5 is within the range of ±1 about the value representing the selection point presently selected. For example, in a situation where AND gate A2 has been selected by "000010" in the 6-bit binary code, a value which can be generated at the next changing time is "000011" or "000001".

The decoder 6 converts the binary-coded value from the step number setting section 5 into selecting signals SL1 to SL64, i.e., sixty four enabling signals, for controlling AND gates A1 to A64. For example, in the case of changing the binary-coded value supplied to the decoder 6 from "000010" to "000001", two bits in the six bits thereof are inverted. In the case of change from the 31st stage to the 32nd stage, the binary-coded value supplied to the decoder 6 is changed from "011111" to "100000", that is, all the bits are changed.

In such a case of changing a plurality of bits, it is possible that in the sixty four enabling signals (selecting signals SL1 to SL64) some of decoded bits which are not to have the enabling value will have the enabling value for an instant due to a difference between the time periods for processing the bits in the decoder 6. That is, some AND gates not to be selected may be selected for an instant.

In such a case, an instantaneous pulse-like signal occurs in the output of the selector 1, so that a so-called spike is caused in the output clock signal $S_{OSC}$.

Figure 10:
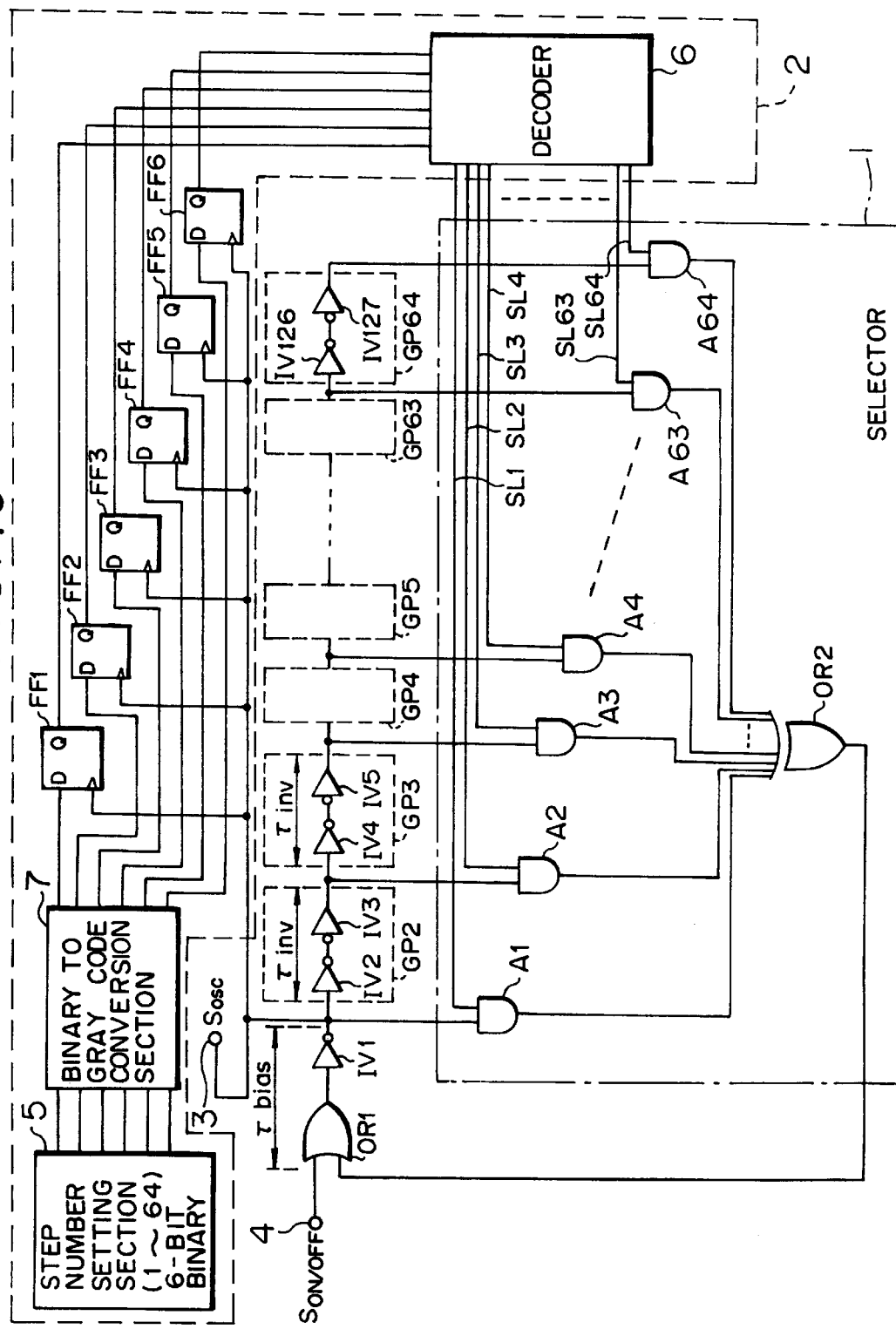
FIG. 10 is a block diagram of a 64-step changeable ring oscillator which represents a third embodiment of the present invention, and which is provided with a binary to gray code conversion section.

The ring oscillator shown in FIG. 10 is arranged to prevent a reduction in performance due to occurrence of such a spike. The ring oscillator shown in FIG. 10 is formed by adding a binary to gray code conversion section 7 to the circuit shown in FIG. 5. The sections other than the binary to gray code conversion section 7 are the same as those shown in FIG. 5 and the description for them will not be repeated.

In this ring oscillator, bits of the 6-bit binary code output from the step number setting section 5 are converted into bits of a 6-bit gray code in the binary to gray code conversion section 7. The gray code bits are supplied to the flip-flops FF1 to FF6 to be latched and supplied to the decoder 6 by rises of the output of inverter IV1.

FIG. 12 shows groups of binary code bits corresponding to the values 1 to 64 and groups of gray coded bits converted from the binary code bits.

As can be understood from FIG. 12, the gray code is characterized in that only one of the six bits formed of each group of code bits is changed when the corresponding decimal value is changed by one.

Figure 11:
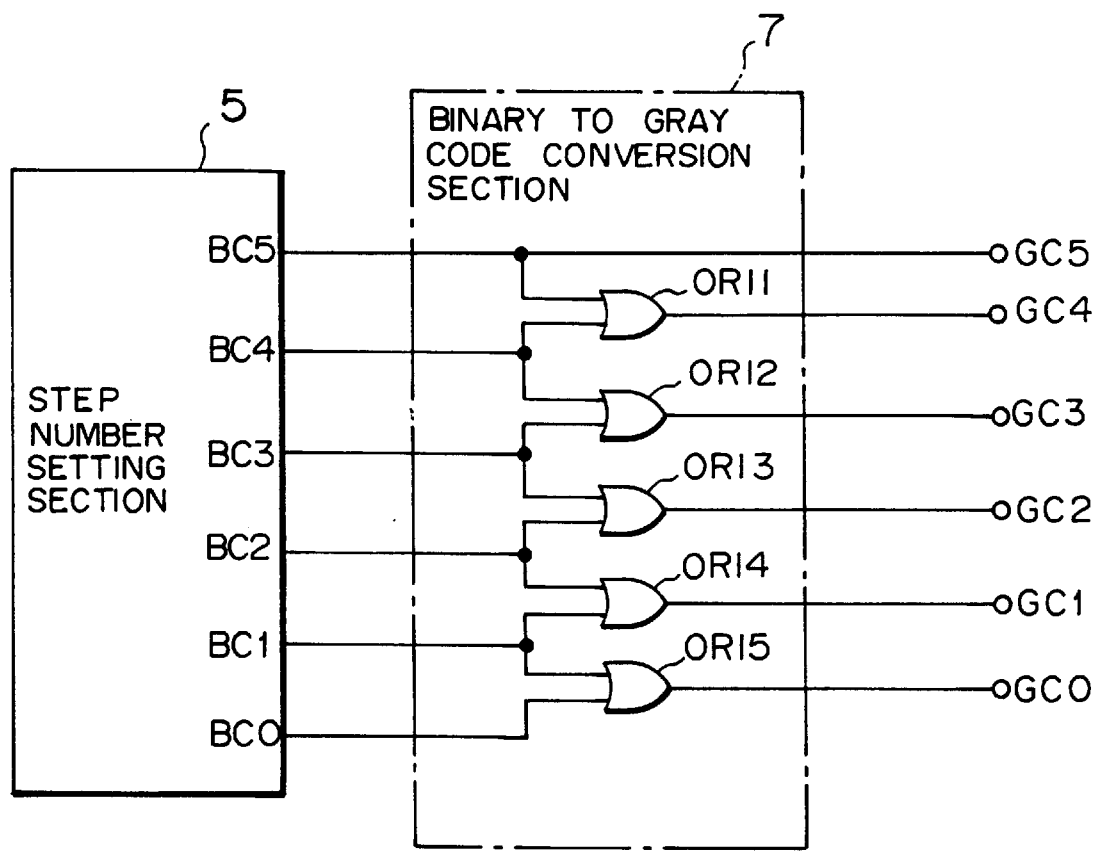
FIG. 11 is a block diagram showing details of the binary to gray code conversion section shown in FIG. 10.

The binary to gray code conversion section 7 arranged to perform conversion in this manner is formed of, for example, five OR gates OR11 to OR15 as shown in FIG. 11.

That is, a bit BC5 which is a most significant bit in the 6-bit binary code is directly set as a bit GC5 which is a most significant bit in the gray code.

Bits BC5 and BC4 in the binary code are input to OR gate OR11, and the logical sum of bits BC5 and BC4 is set as a bit GC4 in the gray code.

Bits BC4 and BC3 in the binary code are input to OR gate OR12, and the logical sum of bits BC4 and BC3 is set as a bit GC3 in the gray code.

Bits BC3 and BC2 in the binary code are input to OR gate OR13, and the logical sum of bits BC3 and BC2 is set as a bit GC2 in the gray code.

Bits BC2 and BC1 in the binary code are input to OR gate OR14, and the logical sum of bits BC2 and BC1 is set as a bit GC1 in the gray code.

Bits BC1 and BC0 in the binary code are input to OR gate OR15, and the logical sum of bits BC1 and BC0 is set as a bit GC0 in the gray code.

The thus-arranged binary to gray code conversion section 7 effects conversion as shown in FIG. 12 and supplies the gray code corresponding to the value designating a selected point. In the code input to the decoder 6 in this embodiment, the number of bits inverted at the time of changing the loop connection is always one.

Therefore, there is no possibility of occurrence of a time difference in processing a plurality of converted bits. Accordingly, there is no possibility of occurrence of an expected enabling signal on the lines of selecting signals SL1 to SL64.

Consequently, in the ring oscillator shown in FIG. 10, the possibility of occurrence of an instantaneous pulse like signal in the output of the selector 1 when the selector 1 is changed is eliminated, thereby preventing occurrence of a spike in the output clock signal $S_{OSC}$.

6. PLL circuit Using Variable Oscillation Frequency Ring Oscillator

An example of a PLL circuit using a ring oscillator arranged so as to be variable in oscillation frequency like those described above will next be described with reference to FIG. 13.

Figure 13:
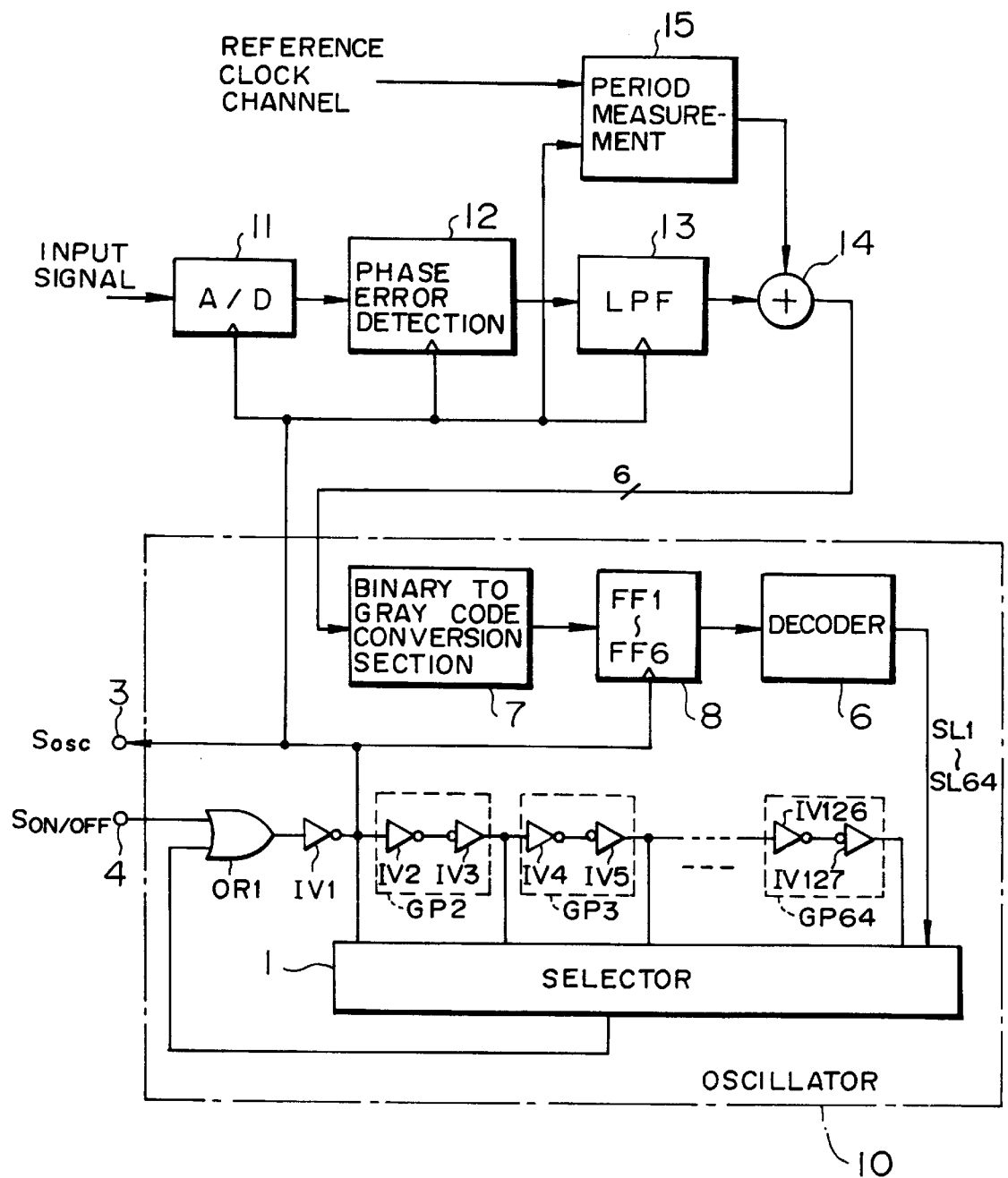
FIG. 13 is a block diagram of a digital PLL circuit to which the ring oscillator of the present invention is adapted.

FIG. 13 is a block diagram of a digital PLL circuit in which a phase locked loop is formed mainly by a phase error detection section 12, a low-pass filter 13 and an oscillator 10.

In this embodiment of the present invention, a ring oscillator in a form such as that shown in FIG. 9 is used as oscillator 10. That is, inverters IV1 to IV127 are connected in series and the output of one of inverter IV1 and inverter groups GP2 to GP64 is selected by a selector 1 to be returned to an OR gate OR1.

The value of a selection point selected by the selector 1 is supplied as a value in a 6-bit binary code to a binary to gray code conversion section 7. The binary to gray code conversion section 7 converts the 6-bit binary code into a gray code and supplies the gray code to a flip-flop section 8, which corresponds to flip flops FF1 to FF6 shown in FIG. 10. When the output of inverter IV1 rises, the gray code value corresponding to the selection point to be selected by the selector 1 is supplied to the decoder 6. The selection of AND gates A1 to A64 such as those shown in FIG. 10 is controlled through selecting signals SL1 to SL64 decoded from the gray code value and output from the decoder 6.

In the oscillator 10, the frequency of clock signal $S_{OSC}$ output through a terminal 3 is variably controlled on the basis of an output from an adder 14. Also, control signal $S_{ON/OFF}$ is supplied to the OR gate OR1 through a terminal 4, thereby controlling stoppage or continuation of the oscillating operation.

The PLL circuit using the oscillator 10 formed of the ring oscillator of the present invention as described above may be arranged in such a manner that a phase error between an input signal and an output clock signal is detected and the value for setting a selection point selected by the selector 1 is generated according to the detected phase error, thereby generating clock signal $S_{OSC}$ synchronized with the input signal.

The input signal is converted into digital data by an A/D converter 11 and the converted digital data is supplied to the phase error detection section 12. Clock signal $S_{OSC}$ output from the oscillator 10 is used as a sampling clock in the A/D converter 11.

Clock signal $S_{OSC}$ output from the oscillator 10 is also supplied to the phase error detection section 12. On the basis of this signal, a phase error from the input signal is detected. Phase error detection information thereby obtained is supplied to the binary to gray code conversion section 7 through the low-pass filter 13 and the adder 14. Thus, by using such a loop, a PLL circuit having an oscillation frequency (frequency of clock signal $S_{OSC}$) controlled on the basis of a phase error between an input signal and clock signal $S_{OSC}$ can be realized.

The oscillator 10 formed of a ring oscillator, however, does not have a self-oscillation frequency and therefore requires setting an oscillation frequency to be used as a reference when no input is supplied. That is, it is necessary to set a selection point selected by the selector 1 for obtaining a reference frequency. A period measuring section 15 outputs a value (6-bit binary code) corresponding to such a reference selection point, and this value is supplied to the oscillator 10 (binary to gray code conversion section 7) through the adder 14.

Accordingly, error information detected by the phase error detection section 12 is input to the oscillator 10 after undergoing addition or subtraction with the reference value in the adder 14, thereby making it possible to suitably control the oscillation frequency according to the phase error state.

In the period measuring section 15, the period of clock signal $S_{OSC}$ is measured on the basis of a reference channel clock. For example, a detection is thereby made as to whether clock signal $S_{OSC}$ is out of a PLL lock range. If clock signal $S_{OSC}$ is out of a predetermined frequency range, the period measuring section 15 outputs such a value as to change the reference oscillation frequency, i.e., the selection point selected by the selector 1, according to the deviation from the predetermined frequency range. If this PLL circuit is used in a digital audio tape player or the like, selection points may be set to obtain predetermined reference frequencies according to a plurality of operating modes (various modes such as play back and fast forward modes).

The PLL circuit using the oscillator 10 formed of the ring oscillator of the present invention as described above can be realized as a digital PLL circuit which does not require a master clock having a high frequency several times to several tens of times higher than the frequency of a reproducing clock, i.e., clock signal $S_{OSC}$.

Because clock signal $S_{OSC}$ is used as a sampling clock for A/D converter 11 in this embodiment, the need for arithmetic processing necessitated with respect to an error in phase error detection value caused in the case of sampling using a master clock asynchronous with an input signal can be eliminated, thereby achieving a reduction in processing time as well as a reduction in circuit scale.

According to the present invention, as described above, a ring oscillator formed of a loop using a logical inversion circuit is arranged to perform a control for variably setting the number of logical inversion circuits contained in the loop. Thus, a ring oscillator variable in oscillation frequency can be realized.

Also, to such a ring oscillator, a logical stage arranged to select execution or stoppage of the logical inversion output operation according to the input logical state of an oscillation control signal may be added at a desired one of the logical conversion circuits, thereby making it possible to control continuation and stoppage of the oscillating operation. Also, the oscillating operation may be started after being stopped for a necessary time period from a time when the oscillator is started to generate an oscillation output, thereby enabling the desired output oscillation frequency to be obtained in a favorable condition.

Oscillation frequency change control circuits may be arranged so that with respect to control of changing a selection point one time by the selection circuit, the range of selectable selection points selectable is set limitedly in each of the opposite directions from the presently-selected selection point, thereby preventing generation of an unstable frequency output at the time of changing the oscillation frequency.

The oscillation frequency change control circuit may also be arranged so that selection points to be selected by the selection circuit are expressed by binary numbers of a predetermined number of bits, and so that one of the binary numbers is decoded into a selection control signal which is supplied to the selection circuit. As these binary numbers, gray-coded numbers each having only one bit inverted when the corresponding expressed value is changed by one may be used, thereby eliminating the possibility of occurrence of a so-called spike in the oscillation output signal and preventing a deterioration in the quality of the output signal.

A PLL circuit in which the frequency of a signal output from a variable frequency oscillation circuit is controlled according to phase error information of an input signal uses as the variable frequency oscillation circuit a ring oscillator arranged as described above. That is, change of a selection point selected by the selection means is controlled according to the phase error information of the input signal so that the oscillation frequency is variable, thereby changing a clock synchronized with the input signal. In this manner, a PLL circuit can be formed without using a master clock, thus overcoming the problem of failure in using a digital PLL circuit due to a limit to the increase in the frequency of a master clock. Thus, digital PLL circuits which can easily be used in various technical fields can be realized.

What is claimed is:

1. A ring oscillator having a selectable oscillation frequency, comprising:

first to nth logical inversion means connected in series, where n is an odd number equal to or larger than 3;

selection means for changing a connection point between said first to nth logical inversion means connected in series by selecting an output point of an odd-numbered logical inversion means of said first to nth logical inversion means and connecting the selected output point to an input point of the first logical inversion means forming an initial stage of the ring oscillator; and selection control means for controlling said selection means to select output points of a plurality of odd-numbered logical inversion means in said first to nth logical inversion means connected in series; and a step number setting section for limiting ranges of logical inversion means about a first one of the odd-numbered logical inversion means in said first to nth logical inversion means connected in series, in which ranges a connection point can be changed by a changing operation from the first one of the odd-numbered logical inversion means to a second one of the odd-numbered logical inversion means located in one of forward and backward directions from the first one of the odd-numbered logical inversion means by performing the changing operation one time.

2. The ring oscillator according to claim 1, further comprising oscillation operation control means for controlling continuation or stoppage of an oscillating operation of said first to nth logical inversion means, whereby continuation or stoppage of the oscillating operation in a loop of said ring oscillator can be controlled.

3. The ring oscillator according to claim 2, wherein the oscillation operation control means is operated when a power supply is turned on.

4. A ring oscillator having a selectable oscillation frequency, comprising:

first to nth logical inversion means connected in series, where n is an odd number equal to or larger than 3;

selection means for changing a connection point between said first to nth logical inversion means connected in series by selecting an output point of an odd-numbered logical inversion means of said first to nth logical inversion means and connecting the selected output point to an input point of the first logical inversion means forming an initial stage of the ring oscillator; and selection control means for controlling said selection means to select output points of a plurality of odd-numbered logical inversion means in said first to nth logical inversion means connected in series; and wherein when changing a connection point from an output point of a first one of odd-numbered logical inversion means in said first to nth logical inversion means connected in series to an output point of a second one of the odd-numbered logical inversion means located in one of the forward and backward directions from the first one of the odd-numbered logical inversion means, the selection control means controls the selection means so that the selection means changes the connection point in a stepping manner by performing the changing operation at least two times.

5. A ring oscillator having a selectable oscillation frequency, comprising:

first to nth logical inversion means connected in series, where n is an odd number equal to or larger than 3;

selection means for changing a connection point between said first to nth logical inversion means connected in series by selecting an output point of an odd-numbered logical inversion means of said first to nth logical inversion means and connecting the selected output point to an input point of the first logical inversion means forming an initial stage of the ring oscillator; and selection control means for controlling said selection means to select output points of a plurality of odd-numbered logical inversion means in said first to nth logical inversion means connected in series; and decoding means for decoding a binary number having a predetermined number of bits, the binary number representing an output point of one of the odd-numbered logical inversion means in said first to nth logical inversion means selected by said selection means, wherein the selection control means controls the selection means on the basis of the binary number decoded by said decoding means, and wherein a gray code, in which only one of bits representing an increase or decrease of 1 is inverted, is used as said binary number.

* * * * *